United States Patent
Ha et al.

(10) Patent No.: US 11,943,995 B2
(45) Date of Patent: Mar. 26, 2024

(54) CIRCUIT DRIVING ELEMENT AND DISPLAY APPARATUS INCLUDING THE SAME

(71) Applicant: LX SEMICON CO., LTD., Daejeon (KR)

(72) Inventors: Dam Ha, Daejeon (KR); Gyeong Hyeon Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 299 days.

(21) Appl. No.: 17/541,680

(22) Filed: Dec. 3, 2021

(65) Prior Publication Data
US 2022/0181563 A1 Jun. 9, 2022

(30) Foreign Application Priority Data
Dec. 8, 2020 (KR) .................. 10-2020-0170247

(51) Int. Cl.
| | |
|---|---|
| *H05K 1/02* | (2006.01) |
| *G06F 1/16* | (2006.01) |
| *G09F 9/00* | (2006.01) |
| *G09F 9/30* | (2006.01) |
| *G09G 3/3225* | (2016.01) |
| *G09G 3/3275* | (2016.01) |
| *H10K 77/10* | (2023.01) |

(52) U.S. Cl.
CPC .......... *H10K 77/111* (2023.02); *G06F 1/1652* (2013.01); *G09F 9/301* (2013.01)

(58) Field of Classification Search
CPC ........ H05K 1/02; H05K 1/0281; H05K 1/147; H05K 1/189; H05K 5/0017; H05K 5/0247; H10K 77/111; G02F 1/13452; G02F 1/13454; G02F 1/133606; G06F 1/1626; G06F 1/1643; G06F 1/1652; G06F 1/1656; G09F 9/00; G09F 9/30; G09F 9/301; G09G 3/3225; G09G 3/3275; G09G 3/3668
USPC .................. 361/749; 174/250; 257/773, 778
See application file for complete search history.

(56) References Cited

U.S. PATENT DOCUMENTS

| | | | | |
|---|---|---|---|---|
| 2019/0341442 | A1* | 11/2019 | Kajiyama | .......... G09F 9/30 |
| 2020/0068733 | A1* | 2/2020 | Lee | ...... G02F 1/13452 |
| 2021/0097939 | A1* | 4/2021 | Chae | ........ G09G 3/3225 |
| 2021/0368658 | A1* | 11/2021 | Tang | ........ G06F 1/1626 |

FOREIGN PATENT DOCUMENTS

KR 10-1585756 B1 1/2016

* cited by examiner

*Primary Examiner* — Xiaoliang Chen
(74) *Attorney, Agent, or Firm* — ROTHWELL, FIGG, ERNST & MANBECK, P.C.

(57) ABSTRACT

The present invention provides a circuit driving element including a driving chip having a long axis and a short axis, the long axis being vertical to a bending axis and a crack prevention layer having a wider area than an area of the driving chip and covering a whole top surface of the driving chip, wherein the circuit driving element is provided in a non-display area of a display panel and is bent with respect to the bending axis, and a display apparatus including the circuit driving element.

16 Claims, 8 Drawing Sheets

CIRCUIT DRIVING ELEMENT AND DISPLAY APPARATUS INCLUDING THE SAME

CROSS-REFERENCE TO RELATED APPLICATIONS

This application claims the benefit of the Korean Patent Application No. 10-2020-0170247 filed on Dec. 8, 2020, which is hereby incorporated by reference as if fully set forth herein.

FIELD OF INVENTION

The present disclosure relates to a display apparatus, and more particularly, to a circuit driving element included in a display apparatus.

BACKGROUND

Various display apparatuses, such as liquid crystal display (LCD) apparatuses and light emitting display apparatuses, include a display panel which displays an image and a circuit driving element which drives the display panel.

Flexible display apparatuses such as foldable display apparatuses and rollable display apparatuses, which are curved or bent in various shapes, have been developed recently. Herein, "being curved or bent" is referred to as "bent". The flexible display apparatuses are provided so that the display panel is bent, and moreover, the circuit driving element needs to be bent.

As described above, when the circuit driving element is bent, a driving chip included in the circuit driving element may be bent together, and in this case, there is a problem where a crack occurs in the driving chip.

Therefore, a circuit driving element capable of being applied to various types of flexible display apparatuses needs a condition where the circuit driving element is implemented so that damage such as a crack does not occur in a driving chip included therein despite various deformations thereof.

SUMMARY

Accordingly, the present disclosure is directed to providing a circuit driving element and a display apparatus including the same that substantially obviate one or more problems due to limitations and disadvantages of the related art.

An aspect of the present disclosure is directed to providing a circuit driving element and a display apparatus including the same, which may solve a problem where a crack occurs in a driving chip when the circuit driving element is bent.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a circuit driving element including a driving chip where a long axis is vertical to a bending axis and a crack prevention layer having a wider area than an area of the driving chip and covering a whole top surface of the driving chip, wherein the circuit driving element is provided in a non-display area of a display panel and is bent with respect to the bending axis.

In another aspect of the present disclosure, there is provided a display apparatus including a display panel including a display area and a non-display area and a circuit driving element connected to the non-display area of the display panel, wherein the circuit driving element includes a driving chip where a long axis is vertical to a bending axis and a crack prevention layer having a wider area than an area of the driving chip and covering a whole top surface of the driving chip, and the circuit driving element is bent with respect to the bending axis.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIGS. 1A and 1B are schematic views of a display apparatus according to an embodiment of the present disclosure.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein.

Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1A:
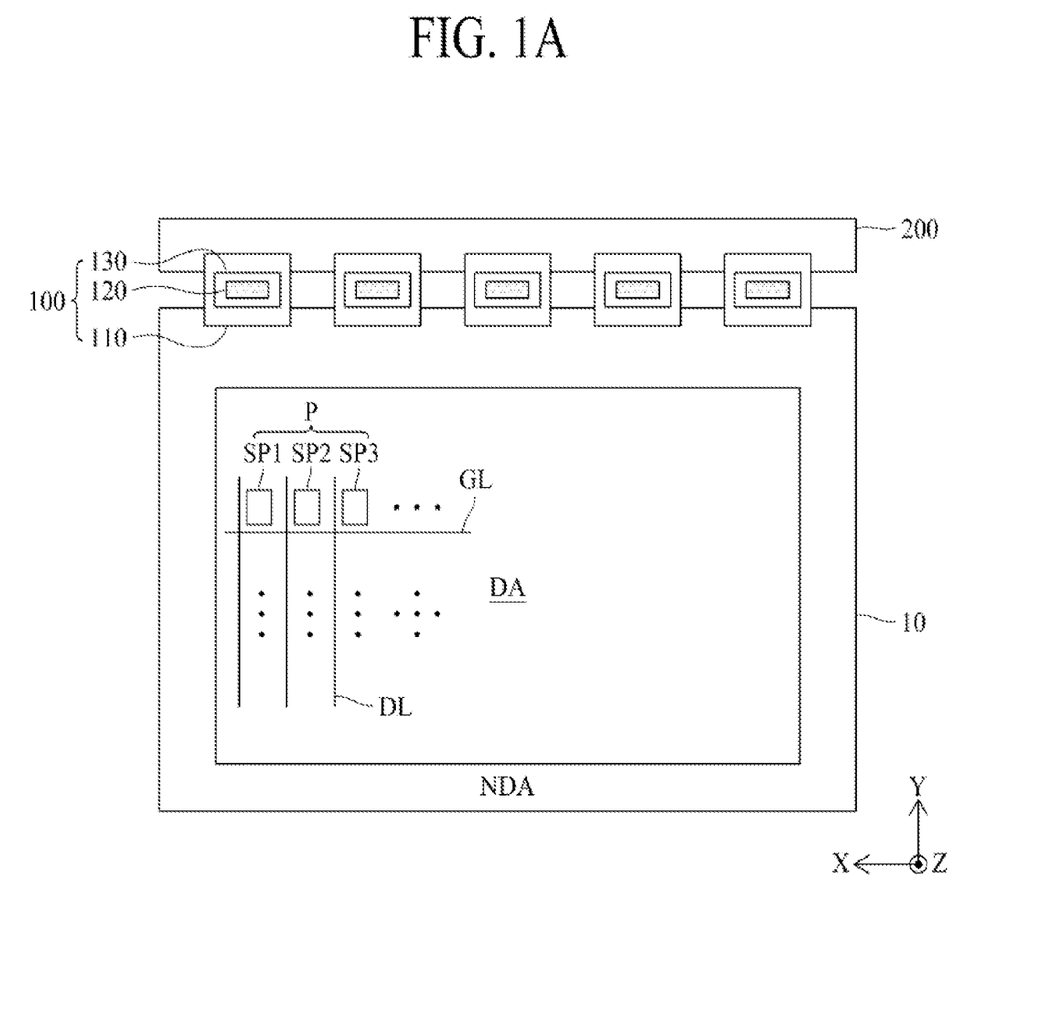
FIG. 1A is a schematic view illustrating a shape before some assembly processes.
Figure 1B:
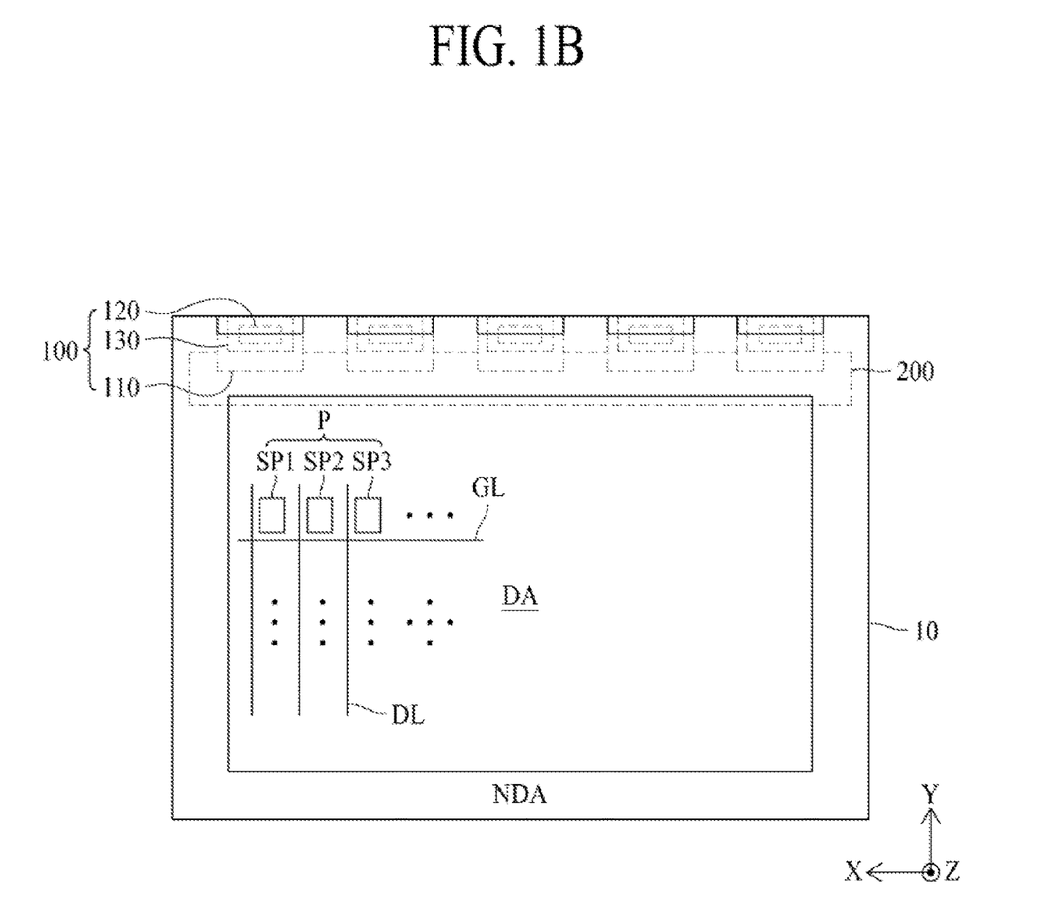
FIG. 1B is a schematic view illustrating a shape after some assembly processes.

FIGS. 1A and 1B are schematic views of a display apparatus according to an embodiment of the present disclosure, FIG. 1A is a schematic view illustrating a shape before some assembly processes, and FIG. 1B is a schematic view illustrating a shape after some assembly processes.

As seen in FIGS. 1A and 1B, the display apparatus according to an embodiment of the present disclosure may include a display panel 10, a circuit driving element 100, and a printed circuit board (PCB) 200.

The display panel 10 may include a display area DA at a center thereof and a non-display area NDA outside the display area DA.

The display area DA may be an area in which an image is displayed, and for example, may include a plurality of unit pixels P each of which includes a first subpixel SP1 emitting red light, a second subpixel SP2 emitting green light, and a third subpixel SP3 emitting blue light. Each of the first to third subpixels SP1 to SP3 may display an image on the basis of a gate signal supplied through a gate line G and a data signal supplied through a data line D. The structure and arrangement type of the first to third subpixels SP1 to SP3 may be variously modified.

The non-display area NDA may be an area in which an image is not displayed, and a plurality of signal lines and a plurality of pads may be provided in the non-display area NDA and may make an electrical connection between the display area DA and the circuit driving element 100.

The display panel 10 may be implemented as various display panels, known to those skilled in the art, such as a liquid crystal display panel, an organic light emitting display panel, and an inorganic light emitting display panel.

The circuit driving element 100 may be provided in the non-display area NDA of the display panel 10. In detail, a plurality of circuit driving elements 100 may be arranged at a certain interval and may be electrically connected to the non-display area NDA of the display panel 10. The plurality of circuit driving elements 100 may be electrically connected to the signal lines and the pads of the non-display area NDA and may drive the unit pixel P provided in the display area DA. Also, the circuit driving element 100 may be connected to the PCB 200 and may be controlled by various circuit elements mounted on the PCB 200.

The circuit driving element 100 may be configured with a chip-on film (COF) where a driving chip 120 is provided on a film 110. In this case, the film 110 may be implemented as a flexible film. Also, the circuit driving element 100 may further include a crack prevention layer 130. The crack prevention layer 130 may be formed to cover the driving chip 120, on a top surface of the driving chip 120 and may prevent a crack from occurring in the driving chip 120 when the circuit driving element 100 is bent. The crack prevention layer 130 may be manufactured as a film type and may be attached on the driving chip 120, but is not limited thereto and may be formed on the driving chip 120 through various processes, known to those skilled in the art, such as a coating process and a deposition process.

Moreover, the driving chip 120 may be implemented as a chip-on glass (COG) type where the driving chip 120 is provided on a glass substrate of the display panel 10 or a chip-on plastic (COP) type where the driving chip 120 is provided on a plastic substrate of the display panel 10, and in this case, the crack prevention layer 130 may be provided on the top surface of the driving chip 120.

The driving chip 120 may be configured as a data driving chip. However, depending on the case, the driving chip 120 may be configured as a gate driving chip.

In a case where the circuit driving element 100 is configured as a data driver provided at one side, for example, an upper side, of the display panel 10, a gate driver may be equipped in the display panel 10, in at least one of a left region and a right region of the display panel 10, which is called "Gate In Panel". In the drawing, an example is illustrated where the circuit driving element 100 is provided at only the one side (for example, the upper side) of the display panel 10, but the present embodiment is not limited thereto and the circuit driving element 100 may be additionally provided at the other side, for example, a lower side of the display panel 10. Depending on the case, the circuit driving element 100 may be additionally provided at a left side or a right side of the display panel 10.

The circuit driving element 100 may extend to be bent from one side of a front surface, for example, an upper side of the front surface of the display panel 10 as seen in FIG. 1A to one side of a rear surface, for example, an upper side of a rear surface of the display panel 10 as seen in FIG. 1B.

In detail, the circuit driving element 100 may extend to the one side of the rear surface, for example, the upper side of the rear surface of the display panel 10 while contacting one end, for example, an upper end of the display panel 10 in a state where the circuit driving element 100 connects the one side of the front surface, for example, the upper side of the front surface of the display panel 10. The circuit driving element 100 may extend from the front surface of the display panel 10 to the rear surface of the display panel 10 while contacting the display panel 10, and thus, a bezel area of the display panel 10 may be reduced.

The PCB 200 may be connected to the plurality of circuit driving elements 100 and may be electrically connected to the driving chip 120 of each of the plurality of circuit driving elements 100. The PCB 200, as seen in FIG. 1B, may be electrically connected to the plurality of circuit driving elements 100 at the one side of the rear surface, for example, the upper side of the rear surface of the display panel 10.

Although not shown in detail, a timing controller and a power supply may be included in the PCB 200. Each of the timing controller and the power supply may be implemented as an integrated circuit (IC) chip and may be mounted on the PCB 200. The timing controller may receive digital video data and timing signals from the outside, generate a data timing control signal and a gate timing control signal on the basis of the received timing signals, and output the data timing control signal and the gate timing control signal to the circuit driving element 100. The power supply may be supplied with a high level voltage from the outside to generate a plurality of driving voltages and may supply the generated plurality of driving voltages to the timing controller and the driving chip 120 of the circuit driving element 100.

The PCB 200 may be implemented as a flexible film.

Figure 2:
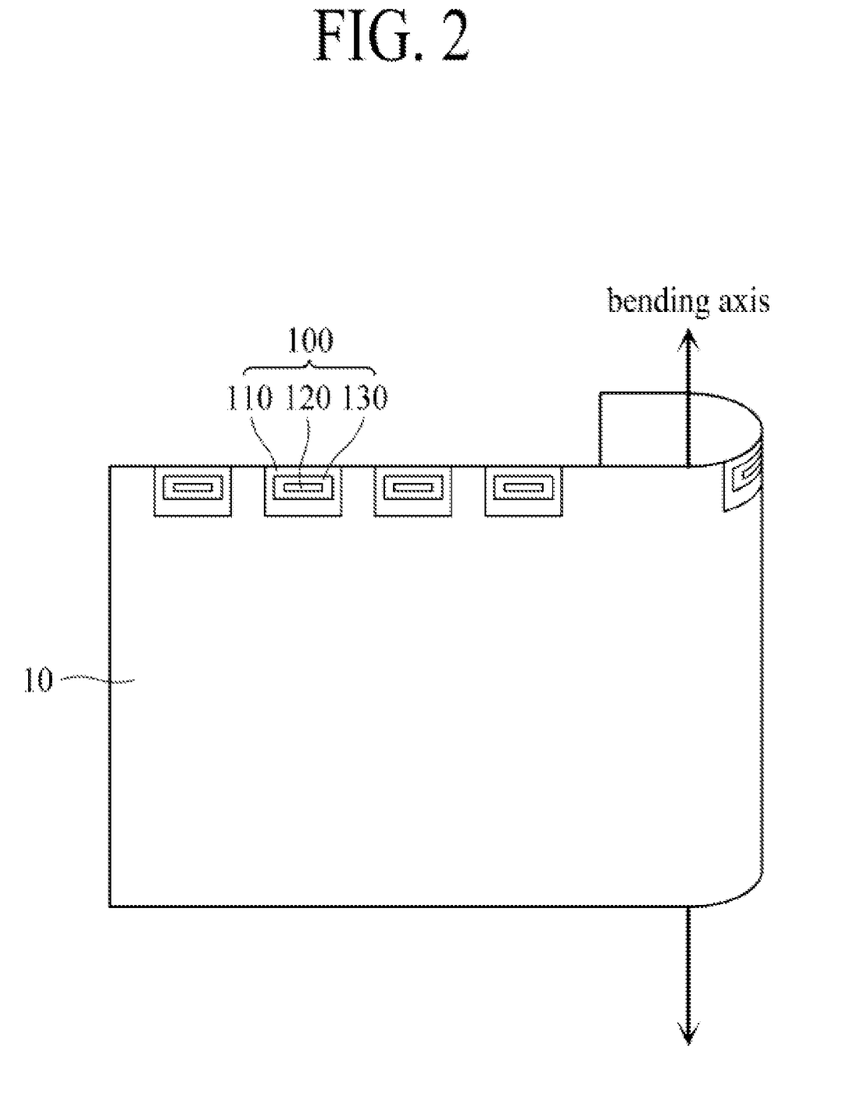
FIG. 2 is a schematic view of a display apparatus according to another embodiment of the present disclosure and relates to a flexible display apparatus.

FIG. 2 is a schematic view of a display apparatus according to another embodiment of the present disclosure and relates to a flexible display apparatus. Herein, it should be construed that flexible display apparatuses include all display apparatuses, where at least a portion thereof is bendable, such as bendable, foldable, and rollable display apparatuses.

As seen in FIG. 2, a display panel 10 may be bent with respect to a bending axis (for example, a vertical bending axis). Accordingly, the display panel 10 may be configured as a flexible display panel.

The bending axis may be designed to be fixed to one side of the display panel 10 without moving and may configure a foldable display apparatus. The display panel may be equipped with a plurality of bending axes. Also, a whole portion of the display panel 10 may be continuously bent and may configure a rollable display apparatus.

The display panel 10 may be bent with respect to the bending axis, and thus, a circuit driving element 100 attached on the display panel 10 may be bent with respect to the bending axis. Accordingly, a film 110 of the circuit driving element 100 may be implemented as a flexible film.

Moreover, a driving chip 120 of the circuit driving element 100 may be bent with respect to the bending axis, and thus, a thickness of the driving chip 120 should be appropriately set so that the driving chip 120 is smoothly bent. A thickness of a general driving chip of the related art is within a range of 500 μm to 600 μm, and in a case where such a thickness range is applied to a driving chip, bending may not be smoothly performed. Therefore, in an embodiment of the present disclosure, a thickness of the driving chip 120 may be set to a range of 150 μm to 250 μm. When a thickness of the driving chip 120 is greater than 250 μm, there may be a possibility that bending is not easily performed, and when a thickness of the driving chip 120 is less than 150 μm, a process of forming the driving chip 120 may not be easily performed. The driving chip 120 having a thin thickness may be obtained through a grinding process performed on a rear surface of a wafer.

As described above, in a case where a thickness of the driving chip 120 is set to be relatively thin so that the driving chip 120 is easily bent, a possibility that a crack occurs in the driving chip 120 in bending may increase. In an embodiment of the present disclosure, the crack prevention layer 130 may be formed on a top surface of the driving chip 120 to cover the top surface of the driving chip 120, and thus, may prevent a crack from occurring in the driving chip 120 when the driving chip 120 is bent. The crack prevention layer 130 may be formed of a flexible material having elasticity, and for example, may include thermo plastic polyurethane (TPU). The TPU may include a polymer obtained by reacting polyol with diisocyanate molecules such as diphenyl methane diisocyanate (MDI) or toluene diisocyanate (TDI).

A thickness of the crack prevention layer 130 may be set to a range of 40 μm to 130 μm. For example, when a thickness of the crack prevention layer 130 is less than 40 μm, a crack prevention function may be reduced, and when a thickness of the crack prevention layer 130 is greater than 130 μm, an adverse effect may increase where a total thickness increase with respect to the enhancement of the crack prevention function.

Figure 3:
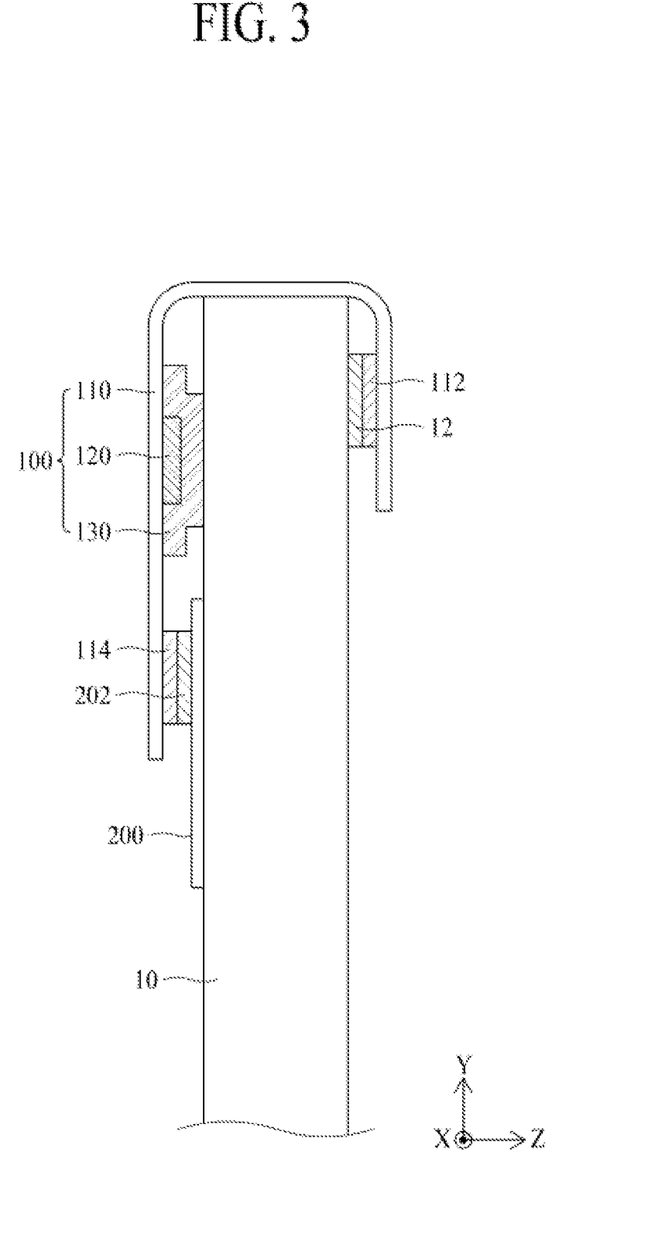
FIG. 3 is a cross-sectional view of a display apparatus according to another embodiment of the present disclosure and is a cross-sectional view according to an embodiment in a bending-axis direction in a structure of FIG. 2.

As seen in FIG. 3, a first signal pad 12 may be formed at an upper side of one surface, for example, a right surface of the display panel 10 which displays an image. The first signal pad 12 may be provided in the non-display area of the display panel 10.

The circuit driving element 100 may include a film 110, a driving chip 120, and a crack prevention layer 130.

The film 110 may extend from one surface, for example, a right surface of the display panel 10 to the other surface, for example, a left surface of the display panel 10 via one end, for example, an upper end of the display panel 10. In this case, a first pad 112 may be provided at one side of one surface of the film 110, wherein the one surface of the film 110 faces the display panel 10, and a second pad 114 may be provided at the other side of the one surface of the film 110. The first pad 112 may be connected to the first signal pad 12 of the display panel 10, and the second pad 114 may be connected to a second signal pad 202 of the PCB 200.

The driving chip 120 may be provided on the one surface of the film 110, and particularly, may face the other surface of the display panel 10. The driving chip 120 may be provided on the same plane as the first pad 112 and the second pad 114, on the film 110.

The crack prevention layer 130 may be formed to cover the driving chip 120 at one surface of the film 110. The crack prevention layer 130 may be formed to contact the other surface of the display panel 10. The crack prevention layer 130 may be provided between the driving chip 120 and the display panel 10 and may protect each of the driving chip 120 and the display panel 10. That is, when the driving chip 120 contacts the display panel 10, the driving chip 120 may be damaged or a scratch may occur in the display panel 10, but in an embodiment of the present disclosure, because the crack prevention layer 130 is provided between the driving chip 120 and the display panel 10, such a problem may be solved.

The second signal pad 202 may be provided on one surface of the PCB 200, wherein the one surface of the PCB 200 faces the film 110 of the circuit driving element 100, and the second signal pad 202 may connect the second pad 114 of the film 110. The other surface of the PCB 200 may contact the other surface of the display panel 10.

Figure 4:
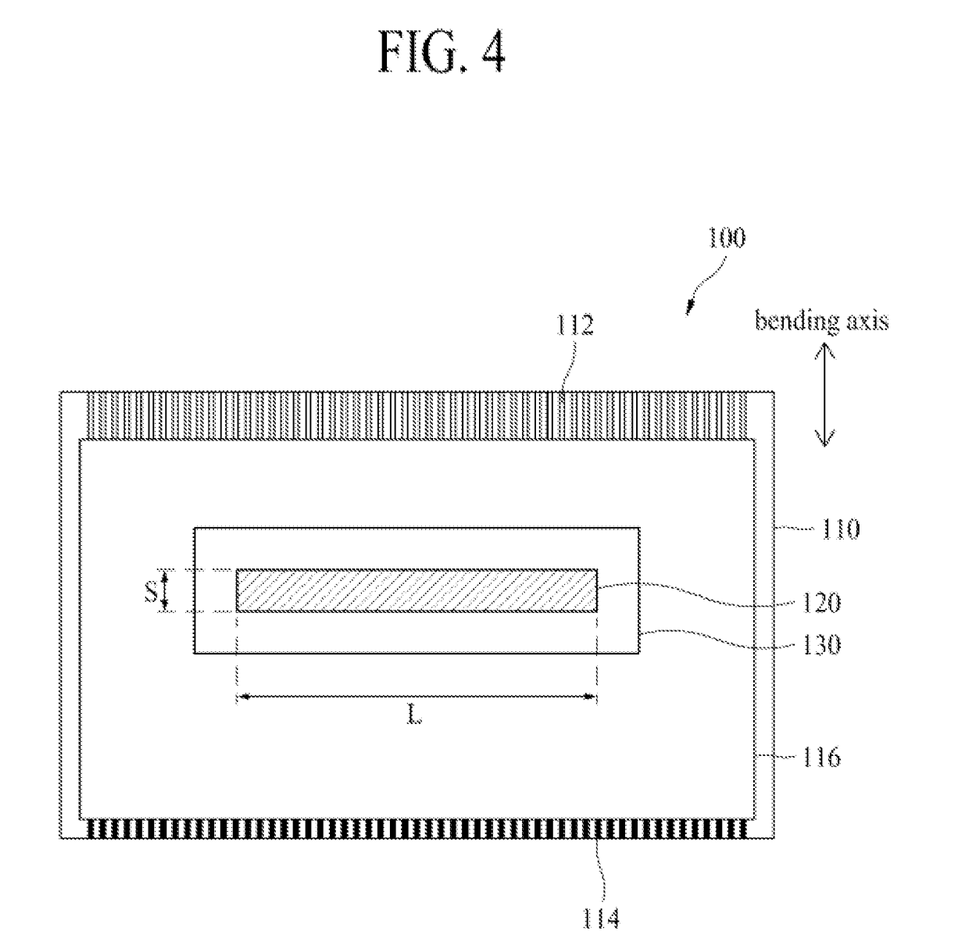
FIG. 4 is a plan view of a circuit driving element according to an embodiment of the present disclosure.

FIG. 4 is a plan view of a circuit driving element 100 according to an embodiment of the present disclosure.

As seen in FIG. 4, a first pad 112 may be provided at one side, for example, an upper side of a film 110, and a second pad 114 may be provided at the other side, for example, a lower side of the film 110.

A driving chip 120 may be provided at a center portion of the film 110. The driving chip 120 may be electrically connected to each of the first pad 112 and the second pad 114. In this case, an insulation layer 116 may be formed between the driving chip 120 and the first and second pads 112 and 114. The insulation layer 116 may be formed to cover a portion of each of the first and second pads 112 and 114 but may be formed not to cover an end portion of each of the first and second pads 112 and 114, and thus, the end portion of each of the first and second pads 112 and 114 may be exposed at the outside.

The driving chip 120 may be implemented to have a long axis L and a short axis S. In this case, the long axis L may be vertical to a bending axis, and thus, the driving chip 120 may be vulnerable to a crack in bending. Accordingly, according to an embodiment of the present disclosure, the crack prevention layer 130 having a wider area than that of the driving chip 120 may cover the driving chip 120, thereby preventing a crack from occurring in the driving chip 120.

Figure 5:
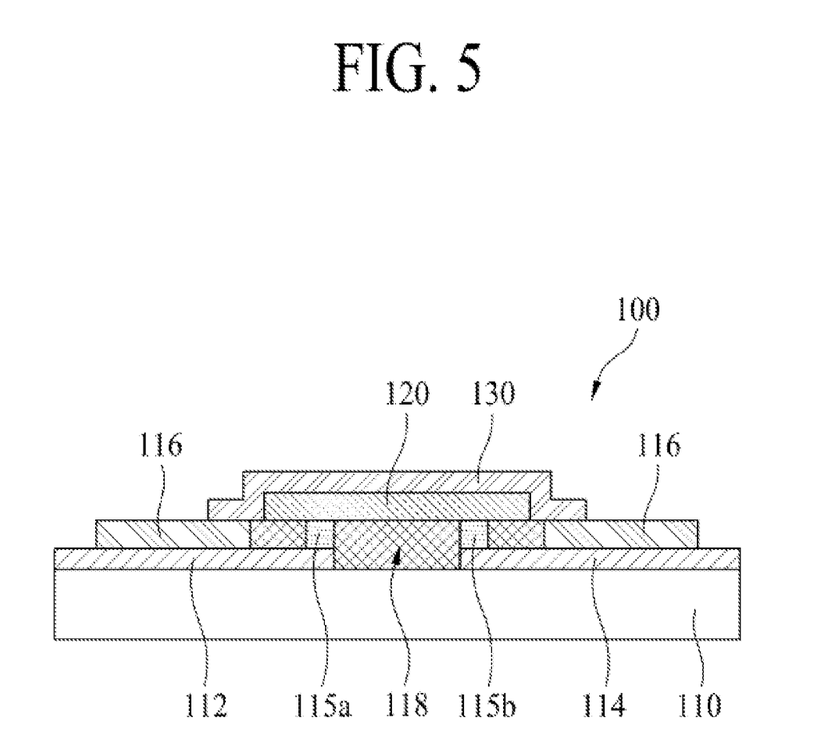
FIG. 5 is a cross-sectional view of a circuit driving element according to an embodiment of the present disclosure.

FIG. 5 is a cross-sectional view of a circuit driving element 100 according to an embodiment of the present disclosure.

As seen in FIG. 5, a first pad 112 and a second pad 114 may be provided on one surface of a film 110. The first pad 112 and the second pad 114 may be apart from each other.

A first bump 115a may be provided on a top surface of the first pad 112, and a second bump 115b may be provided on a top surface of the second pad 114. A driving chip 120 may be provided on the top surface of the first bump 115a and the second bump 115b. Accordingly, the driving chip 120 may be electrically connected to the first pad 112 through the first bump 115a, and the driving chip 120 may be electrically connected to the second pad 114 through the second bump 115b.

An insulation layer 116 may be formed on the first pad 112 and the second pad 114. The insulation layer 116 may be formed not to cover a portion, for example, an end portion of each of the first pad 112 and the second pad 114, and thus, the end portion of each of the first pad 112 and the second pad 114 may be exposed at the outside. The insulation layer 116 may be formed not to overlap the driving chip 120. Also, a polymer resin 118 may be filled into a space between the film 110 and the driving chip 120. The polymer resin 118 may also be filled into a space between the driving chip 120, the first and second pads 112 and 114, and the insulation layer 116.

A crack prevention layer 130 may be formed on a top surface of the driving chip 120. The crack prevention layer 130 may extend from the top surface of the driving chip 120 to a top surface of the insulation layer 116. The crack prevention layer 130 may be formed to overlap a whole portion of the driving chip 120, and moreover, may be formed to overlap at least a portion of the insulation layer 116. Therefore, the crack prevention layer 130 may be formed to contact the whole top surface of the driving chip 120, or may be formed to contact at least a portion of the top surface of the insulation layer 116. As described above, the crack prevention layer 130 may be formed to overlap at least a portion of the insulation layer 116, and thus, may prevent a crack from occurring in the driving chip 120 and may prevent a crack from occurring in an interface between the driving chip 120 and the insulation layer 116.

Figure 6:
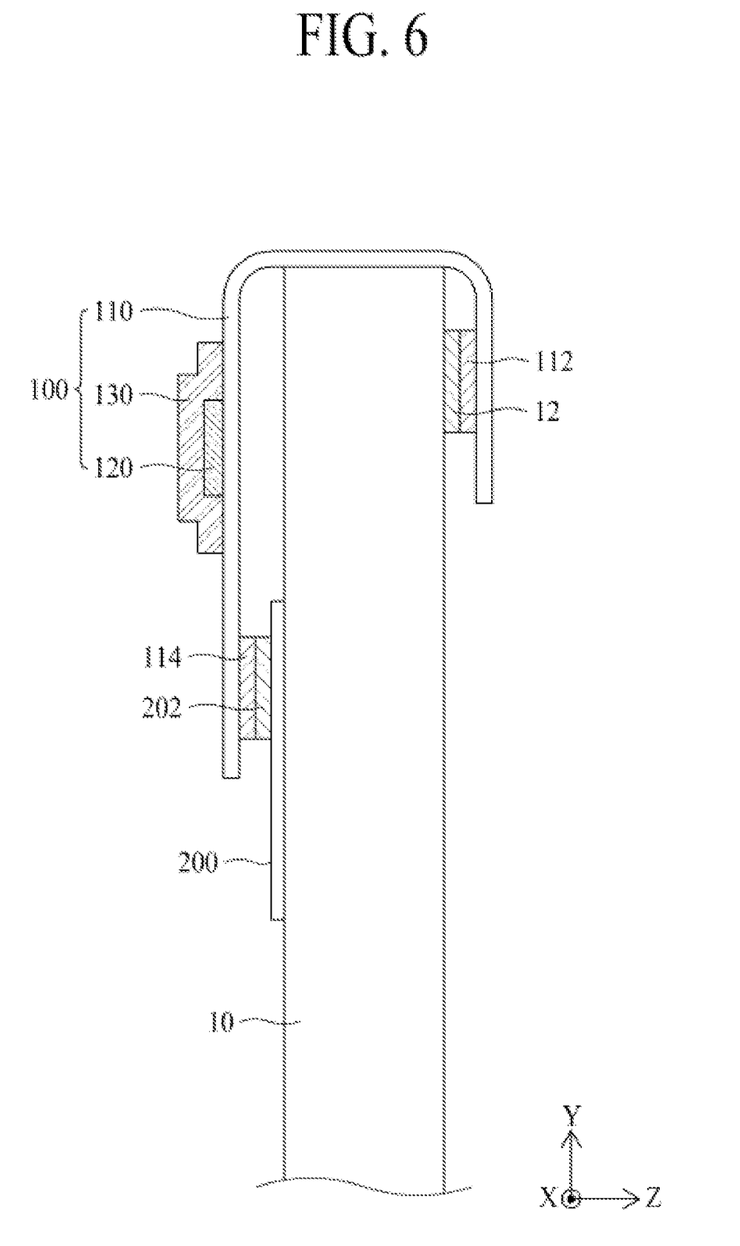
FIG. 6 is a cross-sectional view of a display apparatus according to another embodiment of the present disclosure and is a cross-sectional view according to another embodiment in the bending-axis direction in the structure of FIG. 2.

FIG. 6 is a cross-sectional view of a display apparatus according to another embodiment of the present disclosure and is a cross-sectional view according to another embodiment in the bending-axis direction in the structure of FIG. 2. FIG. 6 differs from a structure of FIG. 3 described above in that positions of the driving chip 120 and the crack prevention layer 130 are changed. Therefore, like reference numerals refer to like elements, and different elements will be described below.

According to FIG. 3 described above, the driving chip 120 and the crack prevention layer 130 may be provided on one surface of the film 110 facing the display panel 10, and thus, the crack prevention layer 130 may be formed to contact the display panel 10.

On the other hand, according to FIG. 6, the driving chip 120 and the crack prevention layer 130 may be provided on the other surface of the film 110 which does not face the display panel 10, and thus, the crack prevention layer 130 may be formed not to contact the display panel 10.

Figure 7:
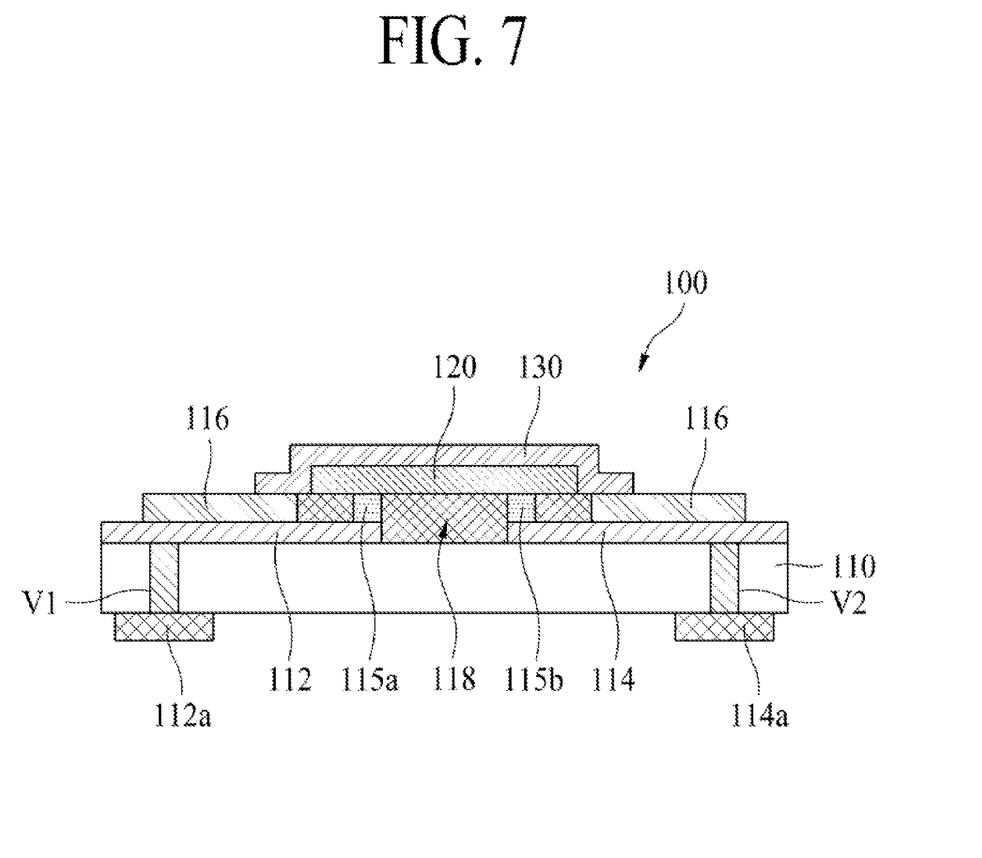
FIG. 7 is a cross-sectional view of a circuit driving element according to another embodiment of the present disclosure and relates to a circuit driving element capable of being applied to a structure of FIG. 6 described above.

FIG. 7 is a cross-sectional view of a circuit driving element 100 according to another embodiment of the present disclosure and relates to a circuit driving element 100 capable of being applied to a structure of FIG. 6 described above.

FIG. 7 differs from a structure of FIG. 5 described above in that a first via V1 and a second via V2 are provided in a film 110 and first and second pad extension portions 112a and 114a are provided on the other surface of the film 110, for example, a bottom surface of the film 110. Therefore, like reference numerals refer to like elements, and different elements will be described below.

As seen in FIG. 7, the first via V1 may be formed in a certain region of the film 110 overlapping the first pad 112, and the second via V2 may be formed in a certain region of the film 110 overlapping the second pad 114. The first via V1 may be electrically connected to the first pad 112, and the second via V2 may be electrically connected to the second pad 114. The first via V1 and the second via V2 may be formed to pass through the film 110.

The first pad extension portion 112a electrically connected to the first via V1 while overlapping the first via V1 and the second pad extension portion 114a electrically connected to the second via V2 while overlapping the second via V2 may be provided in the bottom surface of the film 110. Accordingly, the first pad extension portion 112a may be electrically connected to the first pad 112 via the first via V1, and the second pad extension portion 114a may be electrically connected to the second pad 114 via the second via V2.

Therefore, according to a structure of FIG. 7, the driving chip 120 may be provided on one surface of the film 110, and the first and second pad extension portions 112a and 114a may be provided on the other surface of the film 110. The first and second pads 112 and 114 provided on a surface opposite to the driving chip 120 in a structure of FIG. 6 described above may correspond to the first and second pad extension portions 112a and 114a of FIG. 7.

The first pad extension portion 112a in the structure of FIG. 7 may be connected to the first signal pad 12 of the display panel 10 in FIG. 6 described above, and the second pad extension portion 114a may be connected to the second signal pad 202 of the PCB 200 in FIG. 6 described above. Therefore, in the structure of FIG. 7, a top surface of the first pad 112 and a top surface of the second pad 114 may not be exposed at the outside. Accordingly, although not shown, an insulation layer 116 may be formed to cover the whole top surface of the first pad 112 and the whole top surface of the second pad 114.

According to the embodiments of the present disclosure, because a circuit driving element includes a crack prevention layer provided on a driving chip, a crack may be prevented from occurring in the driving chip when the circuit driving element is bent.

According to the embodiments of the present disclosure, because a long axis of the driving chip is vertical to a bending axis, the driving chip may be vulnerable to a crack when being bent, but the crack prevention layer having a wider area than that of the driving chip may be provided to cover the driving chip, thereby preventing a crack from occurring in the driving chip.

According to the embodiments of the present disclosure, the crack prevention layer may be formed to overlap at least a portion of an insulation layer provided on a pad, and thus, may prevent a crack from occurring in an interface between the driving chip and the insulation layer.

According to the embodiments of the present disclosure, the crack prevention layer may be provided between the driving chip and a display panel, thereby preventing the occurrence of damage when the driving chip contacts the display panel.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A circuit driving element comprising:
a driving chip having a long axis and a short axis, the long axis being vertical to a bending axis; and
a crack prevention layer having a wider area than an area of the driving chip and covering a whole top surface of the driving chip,
wherein the circuit driving element is provided in a non-display area of a display panel and is bent with respect to the bending axis.

2. The circuit driving element of claim 1, wherein a thickness of the driving chip is within a range of 150 μm to 250 μm.

3. The circuit driving element of claim 1, wherein the crack prevention layer comprises thermo plastic polyurethane.

4. The circuit driving element of claim 3, wherein the thermo plastic polyurethane comprises a polymer obtained by reacting diisocyanate molecules with polyol.

5. The circuit driving element of claim 1, wherein a thickness of the crack prevention layer is within a range of 40 μm to 130 μm.

6. The circuit driving element of claim 1, further comprising:
a film provided under the driving chip;
a first pad and a second pad provided on the film;
a first bump electrically connecting the first pad to the driving chip and a second bump electrically connecting the second pad to the driving chip;
an insulation layer provided on the first pad and the second pad; and
a polymer resin provided between the film and the driving chip,
wherein the crack prevention layer overlaps at least a portion of the insulation layer.

7. A display apparatus comprising:
a display panel including a display area and a non-display area; and
a circuit driving element provided in the non-display area of the display panel,
wherein
the circuit driving element extends from one side of one surface of the display panel to one side of the other surface of the display panel,
the circuit driving element comprises:
a driving chip having a long axis and a short axis, the long axis being vertical to a bending axis; and
a crack prevention layer having a wider area than an area of the driving chip and covering a whole top surface of the driving chip, and
the circuit driving element is bent with respect to the bending axis.

8. The display apparatus of claim 7, wherein the display panel and the circuit driving element are bent with respect to the same bending axis.

9. The display apparatus of claim 7, wherein the crack prevention layer is provided between the driving chip and the display panel.

10. The display apparatus of claim 9, wherein the crack prevention layer contacts the display panel.

11. The display apparatus of claim 7, wherein the driving chip and the crack prevention layer do not contact the display panel.

12. The display apparatus of claim 7, wherein a thickness of the driving chip is within a range of 150 μm to 250 μm.

13. The display apparatus of claim 7, wherein the crack prevention layer comprises thermo plastic polyurethane.

14. The display apparatus of claim 13, wherein the thermo plastic polyurethane comprises a polymer obtained by reacting diisocyanate molecules with polyol.

15. The display apparatus of claim 7, wherein a thickness of the crack prevention layer is within a range of 40 μm to 130 μm.

16. The display apparatus of claim 7, further comprising:
a film provided under the driving chip;
a first pad and a second pad provided on the film;
a first bump electrically connecting the first pad to the driving chip and a second bump electrically connecting the second pad to the driving chip;
an insulation layer provided on the first pad and the second pad; and
a polymer resin provided between the film and the driving chip,
wherein the crack prevention layer overlaps at least a portion of the insulation layer.

* * * * *